United States Patent [19]

Motohashi

[11] 4,406,018
[45] Sep. 20, 1983

[54] AUTOMATIC FM TUNER

[75] Inventor: Minoru Motohashi, Kawagoe, Japan

[73] Assignee: Pioneer Electronic Corporation, Tokyo, Japan

[21] Appl. No.: 291,181

[22] Filed: Aug. 7, 1981

[51] Int. Cl.³ .......................... H03J 7/24; H03J 7/28; H04B 1/26
[52] U.S. Cl. .................................... 455/164; 455/169
[58] Field of Search ............... 455/161, 164, 169, 192, 455/182; 358/193.1, 195.1

[56] References Cited

U.S. PATENT DOCUMENTS 4,216,546  8/1980  Litt ..................................... 455/164
4,264,976  4/1981  Yamashita ........................... 455/161

*Primary Examiner*—Marc E. Bookbinder

[57] ABSTRACT

In an automatic FM tuner of a voltage synthesizer in which an output from a voltage control oscillator is varied in response to a tuning clock pulse to scan or search a broadcasting frequency wherein when a comparator having an input of the output voltage with S-shaped wave form of FM detector circuit detects that the received broadcasting signal are set in a range of receiving signal with the normal tuning point being set therebetween, a period of the tuning clock pulse is increased, the tuning clock pulses with their periods increased are counted over a range of the received signal, a feeding of the tuning clock pulse is terminated at ½ of the counted value, and thereby a variation of the oscillation frequency of the voltage control oscillator is terminated to show a desired tuning frequency.

1 Claim, 4 Drawing Figures

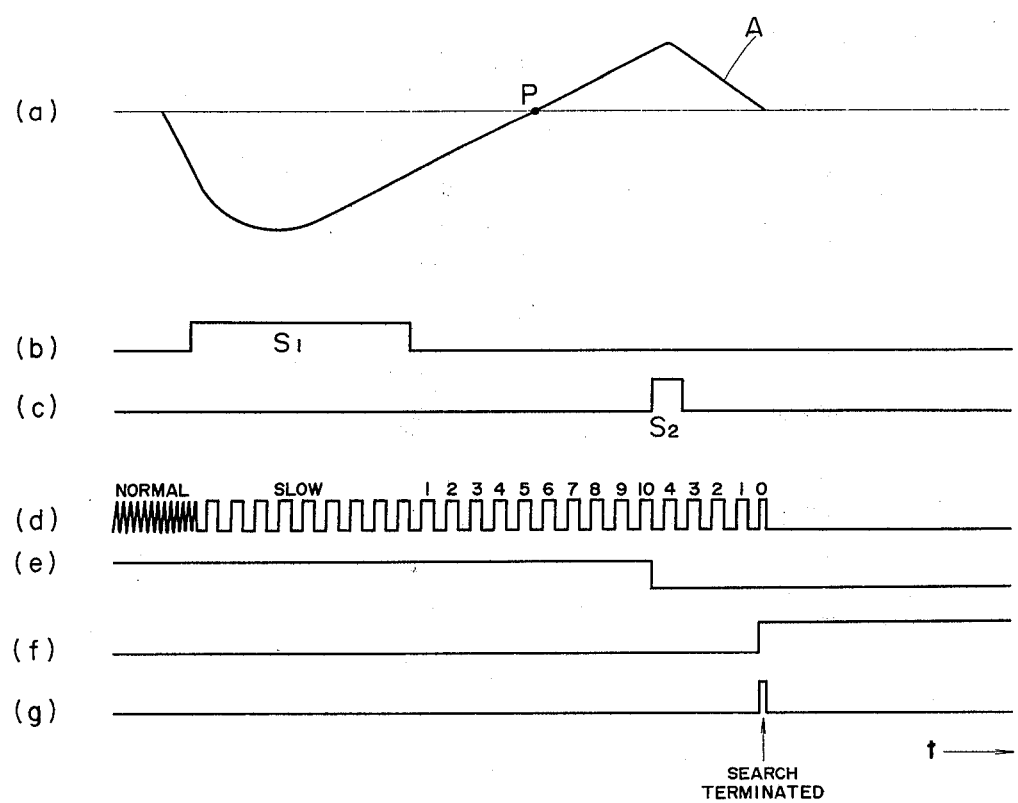

AUTOMATIC FM TUNER

BACKGROUND OF THE INVENTION

This invention relates to an automatic FM tuner of a voltage synthesizer type and more particularly to an automatic FM tuner of a voltage synthesizer type having an improved detecting of the tuning point.

An automatic FM tuner of a voltage synthesizer type is, as shown in FIG. 1 (a), comprised of an antenna 1, a high frequency unit 2, a mixing circuit 3, an intermediate frequency/FM detector circuit 4, a voltage control oscillator 5, and a voltage synthesizer controller 6 for setting an output frequency of the voltage control oscillator 5 by D/A transformation of the tuning clock pulse. In an automatic FM tuner of a voltage synthesizer type, a detecting of the tuned frequency is performed such that the output voltage with S-shaped wave form of FM detector circuit 4 is fed to a window comparator 7 and the output from the window comparator 7 is applied as a stop signal during a search of the broadcasting station. For performing this operation, a conventional or prior art system performed in such a way as when the frequency was searched or scanned toward an increased broadcasting frequency as shown in FIG. 1 (b), the tuning clock pulses shown at B in FIG. 1 (b) are counted from the decreasing point of the output $S_1$ of the window comparator 7 having as its input the output voltage with S-shaped wave form of FM detector circuit 4 shown at a curve (A) in FIG. 1 (b). To the contrary, when the frequency was searched or scanned toward a decreased broadcasting frequency, the tuning clock pulse was counted from a decreasing point of the output $S_1$ of the window comparator 7 and then a position of the desired counting value was applied as a tuning point.

However, a width of the stop signal (a width between the outputs $S_1$ and $S_2$ of the window comparator 7) and the number of tuning clock pulses in the width for every band of the tuner are different and even in a band, they are different in response to the broadcasting frequency. This is due to the fact that the tuning clock pulse has a fixed 10 to 20-bits and that a relation between an oscillation frequency of the voltage control oscillator 5 and a tuning clock pulse is not made to be linear.

Therefore, there was such a problem as the tuning operation was performed by an automatic tuning operation after the broadcasting station was detected during a search of the broadcasting station, and even if a tuning was matched, it was not necessarily to have a correct tuning at the most suitable tuning point.

SUMMARY OF THE INVENTION

It is an object of the present invention to provide an automatic FM tuner of a voltage synthesizer in which a tuning operation is made in response to the most suitable tuning point under the automatic tuning operation.

It is another object of the present invention to provide an automatic FM tuner of a voltage synthesizer in which a tuning is made to be the most suitable tuning point even if a predetermined width in a comparator for sensing a signal receiving range from FM detector circuit is wide.

The above-mentioned object of the present invention may be accomplished by an automatic FM tuner of a voltage synthesizer type in which when a comparator having as its input the output voltage with S-shaped wave form of FM detector circuit senses that the received broadcasting signal is set in a range of receiving signal with a normal tuning point being placed therebetween, the number of tuning clock pulses to be applied to a voltage synthesizer controller are counted over said receiving range, and thereby a position of the tuning clock pulse having value of a half of the counted value.

BRIEF DESCRIPTION OF THE DRAWINGS

FIG. 1 (b) is a wave form for use in illustrating a tuning operation of a conventional automatic FM tuner of a voltage synthesizer type;

FIG. 3 is a wave form for use in illustrating a tuning operation of an automatic FM tuner of one preferred embodiment of the present inention shown in FIG. 2.

DESCRIPTION OF PREFERRED EMBODIMENTS

Figure 1A:
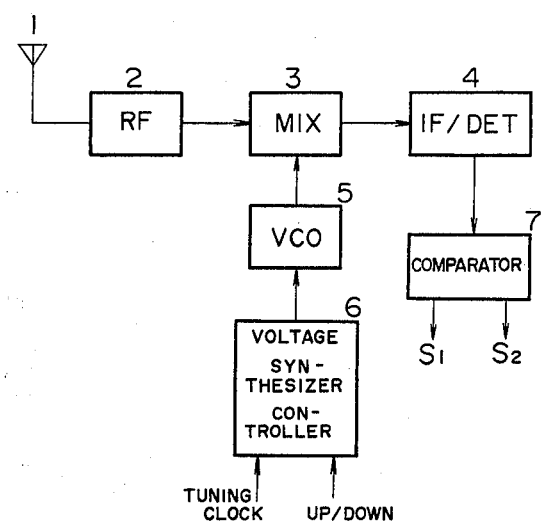
FIG. 1 (a) is a block diagram for showing a conventional automatic FM tuner of a voltage synthesizer type.
Figure 1B:
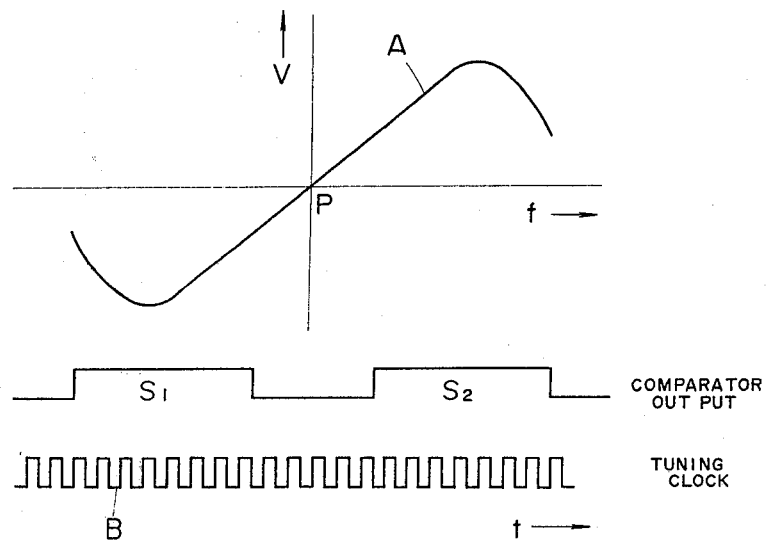
Figure 2:
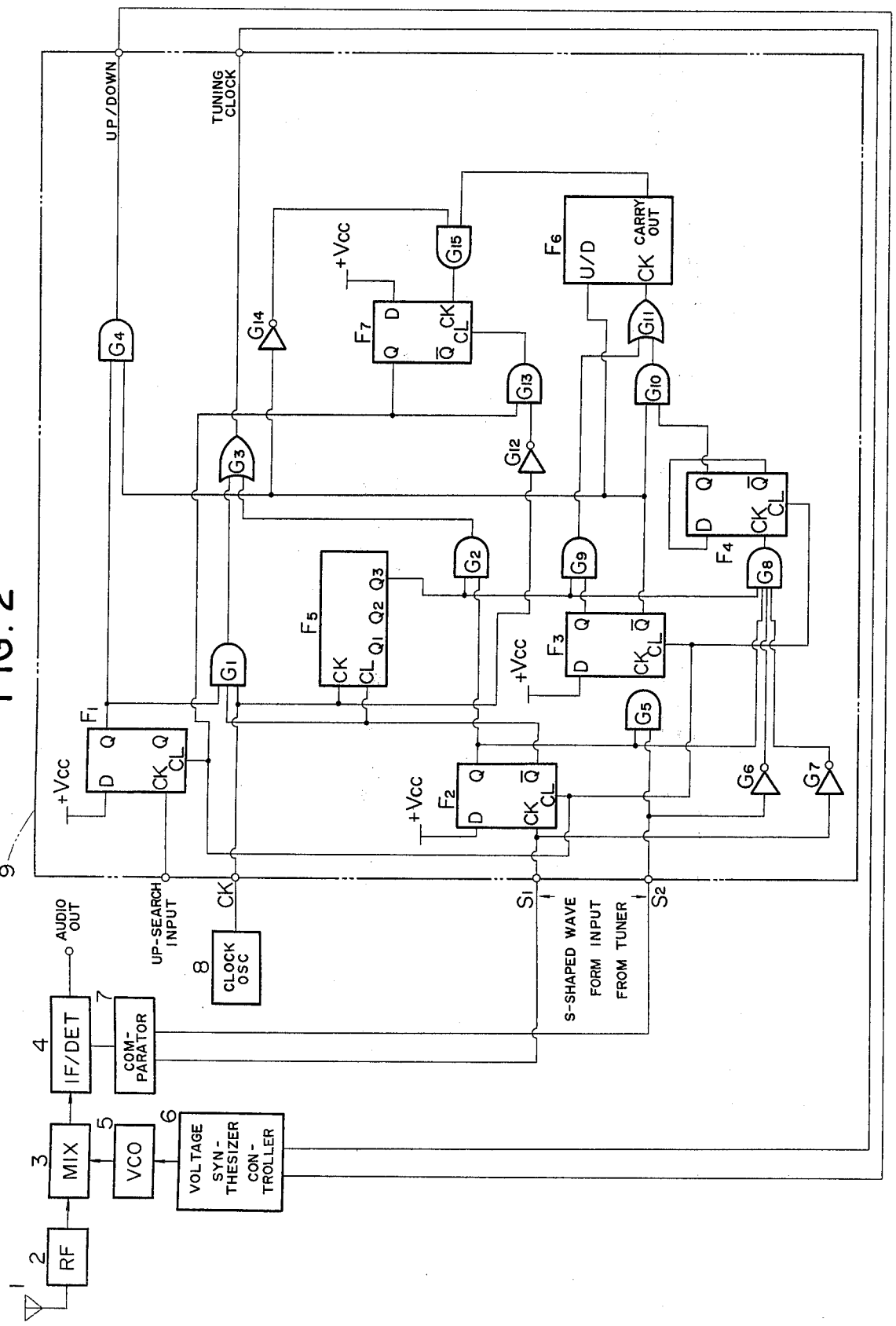
FIG. 2 is a block diagram for showing an automatic FM tuner of one preferred embodiment of the present invention.

Referring now to the drawings, one preferred embodiment of the automatic FM tuner of the present invention will be described.

The automatic FM tuner of the preferred embodiment of the present invention is composed of a high frequency unit 2 having as its input an output voltage from antenna 1, a mixing circuit 3 having as its input both an output of the high frequency unit 2 and an output of the voltage control oscillator 5, an intermediate frequency/FM detector 4 having as its input an output of the mixing circuit 3, a window comparator 7 having as its input a voltage output with S-shaped waveform of FM detector 4, a clock pulse oscillator 8 for use in oscillating a tuning clock pulse, a tuning point sensor circuit 9 having as its input an output of the clock pulse oscillator 8, the outputs $S_1$ and $S_2$ of the window comparator 7 and an up-search input signal, and a voltage synthesizer controller 6 having as its input an up-/down signal of a tuning point sensor circuit 9 and a tuning clock pulse, transforming by D/A said tuning clock pulse and setting the output frequency of the voltage control oscillator.

The tuning point sensor circuit 9 is composed of flip-flops $F_1$ to $F_3$ and $F_7$, a frequency divider $F_4$ having a dividing ratio of 2, a frequency divider $F_5$ having a dividing ratio of 8, an up/down counter $F_6$, AND gates $G_1$, $G_2$, $G_4$, $G_5$, $G_8$ to $G_{10}$, $G_{13}$ and $G_{15}$, OR gates $G_3$ and $G_{11}$, invertors $G_6$, $G_7$, $G_{12}$ and $G_{14}$. The tuning point sensor circuit 9 is an example in which the frequency to be scanned or searched is directed to be increased. Input terminal D of the flip-flop $F_1$ is applied with a voltage + Vcc and its clock terminal CK is applied with an up search signal. Input terminal D of the flip-flop $F_2$ is applied with a voltage + Vcc and its clock terminal CK is applied with the output voltage $S_1$ corresponding to a reference voltage of the window comparator 7. AND gate $G_1$ is applied with the output voltage Q of the flip-flop $F_1$, the output pulse of the clock pulse oscillator 8 and the output voltage $\overline{Q}$ of the flip-flop $F_2$ the clock terminal CK of the frequency divider $F_5$ is applied with the output pulse of the clock pulse oscillator 8, and the clear terminal CL is applied with the output voltage $\overline{Q}$ of the flip-flop $F_2$. AND gate $G_2$ is applied with the output voltage Q of the flip-flop $F_2$ and a divided frequency output voltage $Q_3$ of a frequency divider $F_5$. OR gate $G_3$ is applied with the output voltage of AND gate $G_1$ and the output voltage of AND gate $G_2$, then the output voltage of OR gate $G_3$ is applied, as a tuning clock pulse, to the voltage synthesizer controller 6. AND gate $G_5$ is applied with the output voltage $S_2$ corresponding to a high reference voltage of the window comparator 7 and the output voltage Q of the flip-flop $F_2$. Input terminal D of the flip-flop $F_3$ is applied with a voltage + Vcc and its clock terminal CK is applied with an output voltage of AND gate $G_5$. AND gate $G_4$ is applied with the output voltage Q of the flip-flop $F_1$ and the output voltage $\overline{Q}$ of the flip-flop $F_3$, and the output voltage of AND gate $G_4$ is applied to the voltage synthesizer controller 6 as an up-signal. AND gate $G_8$ is applied with a voltage of which the output voltage Q of the flip-flop $F_2$, the output voltages $S_1$ and $S_2$ of the window comparator 7 are reversed by the invertors $G_6$ and $G_7$, respectively, and with a divided frequency output voltage $Q_3$ of the frequency divider $F_5$. AND gate $G_9$ is applied with the output voltage Q of the flip-flop $F_3$ and the divided frequency output voltage $Q_3$ of the frequency divider $F_5$. At the frequency divider $F_4$, the output voltage of AND gate $G_8$ is applied to the clock terminal CK. To AND gate $G_{10}$ are applied an output voltage $\overline{Q}$ of the flip-flop $F_3$ and a divided frequency output voltage Q of the frequency divider $F_4$. To OR gate $G_{11}$ are applied the output voltage of AND gate $G_9$ and the output voltage of AND gate $G_{10}$. The clock terminal CK of the up/down counter $F_6$ is applied with the output voltage of AND gate $G_{11}$, and the up/down terminal U/D is applied with the output $\overline{Q}$ of the flip-flop $F_3$. To AND gate $G_{15}$ are applied both a voltage in which the output voltage $\overline{Q}$ of the flip-flop $F_3$ is reversed by the invertor $G_{14}$ and a carry output voltage of the up/down counter $F_6$. To the input terminal D of the flip-flop $F_7$ is applied a voltage + Vcc and also to the clock terminal CK is applied the output voltage of AND gate $G_{15}$. To AND gate $G_{13}$ are applied both a voltage in which the output pulse of the clock pulse oscillator 8 is reversed by an invertor $G_{12}$ and an output voltage Q of the flip-flop $F_7$, when the output voltage thereof is applied to the clear terminal CL of the flip-flop $F_7$. The output voltage Q of the flip-flop $F_7$ is applied to the clear terminal CL of the flip-flop $F_1$, clear terminal CL of the flip-flop $F_2$, clear terminal CL of the flip-flop $F_3$ and clear terminal CL of the frequency divider $F_4$.

In this case, the up-search signal would be applied by depressing some keys. When the up-search signal is applied, the flip-flop $F_1$ is set to store or memorize that the up-search signal has been fed. When the flip-flop $F_1$ is set, AND gate $G_1$ opens its gate to cause the output pulse from the clock pulse oscillator 8 through AND gate $G_1$ and OR gate $G_3$ to be fed out to the voltage synthesizer controller 6 as a tuning clock pulse. At the same time, AND gate $G_4$ also opens its gate, and the output voltage of AND gate $G_4$ is made to be a high voltage and applied to the voltage synthesizer controller 6 as an up-output. Then, the automatic FM tuner starts to operate a search action for a broadcasting frequency toward an up-direction.

As the search in an up-direction is proceeded and the output voltage $S_1$ from the window comparator 7 is produced in response to the output voltage with S-shaped wave form generated from FM detector circuit 4, the flip-flop $F_2$ will be set.

The flip-flop $F_2$ is mainly applied as a circuit for making a slow-down search of a frequency, and a setting of the flip-flop $F_2$ causes AND gate $G_1$ to be closed and AND gate $G_2$ to be opened, then a pulse output of which frequency has been divided into $\frac{1}{8}$ from the clock pulse oscillator 8 by the frequency divider $F_5$ is produced at the voltage synthesizer controller 6 as a tuning block pulse through AND gate $G_2$ and OR gate $G_3$. Thus, a search speed for the broadcasting station will be delayed or decreased. The aim for performing this decreased search speed consists in a compensation for a time delay by a filter or D/A transformation in the voltage synthesizer controller 6.

As a search for the broadcasting station is proceeded in its increasing direction, the output voltage $S_1$ of the window comparator 7 is varied from a high level output voltage to a low level output voltage. Then, AND gate $G_8$ open its gate, the output pulse of the frequency divider $F_5$ is further divided into $\frac{1}{2}$ by the frequency divider $F_4$, resulting in making the output pulse of the clock pulse oscillator 8 divided into 1/16 which is passed through AND gate $G_{10}$ and OR gate $G_{11}$ and fed to the up/down counter $F_6$. During this operation, since U/D terminal of the up/down counter $F_6$ is applied with a high potential voltage, the up/down counter $F_6$ performs an up-counting. Also during this operation, since the output is one in which a frequency of the tuning clock pulse is divided by $\frac{1}{8}$, a search in a frequency increasing direction is proceeded, resulting in that the output voltage $S_2$ of the window comparator 7 is varied from a low potential voltage to a high potential voltage. The result that the output voltage $S_2$ of the window comparator 7 has been changed to a high potential voltage causes the flip-flop $F_3$ to be set, the input to the CK terminal of the up/down counter $F_6$ is made such that the input from the frequency divider $F_4$ is prohibited, and in place of that the output pulse from the clock pulse oscillator 8 which has been passed through AND gate $G_9$ and of which frequency has been divided by $\frac{1}{8}$ is fed.

When the flip-flop $F_3$ is set, AND gate $G_4$ closes its gate, the up-down output toward the voltage synthesizer controller 6 and U/$\overline{D}$ terminal of the up/down counter $F_6$ become a low potential voltage and thereby the voltage synthesizer controller 6 and the up/down counter $F_6$ are changed over to a down i.e. frequency decreasing direction. Therefore, a search for the frequency is set to return to a search initiating position when the voltage is set in a high voltage range of the output voltage $S_2$ of the window comparator 7.

As the output is made in a frequency decreasing direction, i.e. down direction, all the count contents stored in the up/down counter $F_6$ are become zero to produce a carry-out output (borrow). The output is passed through AND gate $G_{15}$ to set the flip-flop $F_7$. The output Q of the flip-flop $F_7$ is changed from its low potential output to a high potential output to clear the flip-flop $F_7$ by AND gate $G_{13}$ and at the same time the output Q of the flip-flop $F_7$ clears the flip-flops $F_1$, $F_2$ and $F_3$ and the frequency divider $F_4$ to complete the search operation.

In reference to the above, a pulse in which the output pulse of the clock pulse oscillator 8 is divided by 1/16 for its frequency is counted toward an increased frequency during a period starting from a decreased output voltage of the window comparator 7 to an increased output voltage $S_2$ thereof, a pulse of which frequency is divided by $\frac{1}{8}$ from the output pulse of the clock pulse oscillator 8 is counted from the increased output voltage $S_2$, and a frequency search is completed when the counted value becomes zero, so that when the search is to be completed, it will be completed at a position of a zero output voltage with S-shaped wave form of FM detector circuit 4, that is at a normal tuning point.

The operation described above is as illustrated in FIG. 3. In FIG. 3, (a) shows an output voltage with S-shaped wave form of FM detector circuit 4, (b) shows the output voltage $S_1$ of the window comparator 7, (c) shows the output voltage $S_2$ of the window comparator 7, (d) and (e) show a tuning clock pulse and up/down signal for the voltage synthesizer controller 6, (f) shows a carry output (borrow) of the up/down counter $F_6$, and (g) shows the output voltage Q of the flip-flop $F_7$.

As a result, during a period in which the outputs of the output voltages $S_1$ and $S_2$ of the window comparator 7 are a low voltage output, the tuning clock pulse is divided by $\frac{1}{2}$ with the frequency divider $F_4$ and counted by the up/down counter $F_6$ toward an increased frequency. Thus, since the output voltage $S_2$ of the window comparator 7 is reduced to the output $S_1$ of the window comparator 7 by the same number of tuning clock pulses as that counted by the up/down counter $F_6$ starting from a time in which a low potential output is varied to a high potential output, so that a position where the tuning clock pulse is stopped substantially placed at a central point of a low level output periods for the outputs $S_1$ and $S_2$ of the window comparator 7.

Therefore, even if a linear on straight line part of the output voltage with S-shaped wave form has a low inclination or gradation and also even if a low potential output period for the outputs $S_1$ and $S_2$ of the window comparator 7, the most suitable tuning point can be made so long as the straight or linear line part of the output voltage with S-shaped wave form shows a symmetrical pattern with respect to the tuning point P and further a reference level of the window comparator 7 is set to a symmetrical voltage with a zero potential point being set therebetween.

The above mentioned operation is related to the case where the frequency is increased, a similar construction or circuit arrangement may be applied when the frequency is to be decreased.

As described above, in accordance with the present invention, it is possible to provide an automatic tuning at the most suitable tuning point during a search of the broadcasting station by using an automatic tuner of a voltage synthesizer type.

What is claimed is:

1. An automatic FM tuner in which a broadcasting station frequency is searched by varying an output frequency of a voltage controlled oscillator in response to a voltage synthesizer having clock pulses coupled thereto, comprising:
   an FM detector having an S-shaped detection characteristic defining a normal tuning point within a receiving range,
   a comparator connected to an output of said FM detector to sense the presence of a broadcasting station frequency within said receiving range,
   means responsive to said clock pulses to decrease the frequency thereof for providing decreased frequency clock pulses,
   means for counting a first number of said decreased frequency clock pulses in a predetermined direction while said broadcasting station frequency is present within said receiving range, and
   means for terminating the feeding of clock pulses to said synthesizer when said counting means counts a second number of decreased frequency clock pulses equal to one-half of said first number of pulses while said comparator senses the broadcasting station frequency within said receiving range, and thereby terminating the variation of the output frequency of said voltage controlled oscillator.

* * * * *